(12) United States Patent
Hecht et al.

(10) Patent No.: US 10,982,527 B2
(45) Date of Patent: Apr. 20, 2021

(54) SOLAR POWERED PRESSURIZED ELECTRONICS ENCLOSURE FOR PUMPING UNITS

(71) Applicants: Jaime Jose Hecht, Littleton, CO (US); Tyler Kolden, Littleton, CO (US); Pedro Henrique Borges Torres Perez, Brasilia (BR)

(72) Inventors: Jaime Jose Hecht, Littleton, CO (US); Tyler Kolden, Littleton, CO (US); Pedro Henrique Borges Torres Perez, Brasilia (BR)

( * ) Notice: Subject to any disclaimer, the term of this patent is extended or adjusted under 35 U.S.C. 154(b) by 126 days.

(21) Appl. No.: 16/208,171

(22) Filed: Dec. 3, 2018

(65) Prior Publication Data

US 2019/0203578 A1    Jul. 4, 2019

Related U.S. Application Data

(60) Provisional application No. 62/593,739, filed on Dec. 1, 2017.

(51) Int. Cl.
| | | |
|---|---|---|
| *E21B 47/009* | (2012.01) |
| *H02S 40/38* | (2014.01) |
| *H02S 99/00* | (2014.01) |
| *G01R 35/00* | (2006.01) |
| *G01S 7/481* | (2006.01) |
| *G01S 15/88* | (2006.01) |
| *G01S 17/88* | (2006.01) |
| *G01S 17/10* | (2020.01) |
| *G01S 15/08* | (2006.01) |
| *E21B 43/12* | (2006.01) |
| *H02S 20/30* | (2014.01) |

(52) U.S. Cl.
CPC ............ *E21B 47/009* (2020.05); *G01R 35/00* (2013.01); *G01S 7/4813* (2013.01); *G01S 15/08* (2013.01); *G01S 15/88* (2013.01); *G01S 17/10* (2013.01); *G01S 17/88* (2013.01); *H02S 40/38* (2014.12); *H02S 99/00* (2013.01); *E21B 43/127* (2013.01); *H02S 20/30* (2014.12)

(58) Field of Classification Search
CPC ...... E21B 47/009; E21B 43/127; G01S 17/88; G01S 17/10; G01S 7/4813; G01S 15/88; H02S 40/38; H02S 99/00; H02S 20/30; G01R 35/00
See application file for complete search history.

(56) References Cited

U.S. PATENT DOCUMENTS

| | | | |
|---|---|---|---|
| 2,820,616 A * | 1/1958 | Nabal | .................... H05K 7/202 165/104.34 |
| 9,506,751 B2 | 11/2016 | Zhao | |
| 9,624,765 B2 | 4/2017 | Raglin | |
| 9,689,758 B2 | 6/2017 | Zhao | |

(Continued)

*Primary Examiner* — David Z Huang
(74) *Attorney, Agent, or Firm* — Snell & Wilmer L.L.P.; Russell T. Manning

(57) ABSTRACT

The present disclosure is directed to an electronic monitoring system having various sensors for monitoring a pumping unit and/or well head. In an embodiment, the system includes a load cell and position sensor that generate dynamometer information. The monitoring system is suited for remote well applications as the system is self-powered (e.g., solar powered) and has wireless communication capabilities allowing remote monitoring in substantially real-time.

20 Claims, 11 Drawing Sheets

(56) References Cited

U.S. PATENT DOCUMENTS

| | | | |
|---|---|---|---|
| 10,473,763 B2* | 11/2019 | Schwarz | G01S 17/10 |
| 2002/0080257 A1* | 6/2002 | Blank | H04N 5/23212 |
| | | | 348/345 |
| 2003/0115967 A1* | 6/2003 | Kuhnt | G01L 19/0092 |
| | | | 73/756 |
| 2005/0089425 A1 | 4/2005 | Boone et al. | |
| 2012/0020808 A1 | 1/2012 | Lawson et al. | |
| 2015/0323399 A1 | 11/2015 | Zhao | |
| 2015/0345280 A1 | 12/2015 | Krauss | |
| 2016/0084937 A1* | 3/2016 | Lin | G01S 5/22 |
| | | | 367/13 |
| 2016/0138949 A1 | 5/2016 | Zhao | |
| 2017/0292353 A1* | 10/2017 | Liu | E21B 43/127 |

* cited by examiner

SOLAR POWERED PRESSURIZED ELECTRONICS ENCLOSURE FOR PUMPING UNITS

CROSS REFERENCE

The present application claims priority to U.S. Provisional Application No. 62/593,739 having a filing date of Dec. 1, 2017, the entire contents of which is incorporated herein by reference.

FIELD

The present disclosure is directed to an apparatus for attachment to a pumping unit that securely encloses and powers sensors, computer processors and modems to gather and transmit well head data.

BACKGROUND

Oil is commonly pumped oil from underground reservoirs utilizes a reciprocating downhole pump. At the surface, a motor drives a pump jack or hydraulic pumping unit (hereafter pumping unit) either of which is connected to a polished rod that is in turn connected to a string of sucker rods which extend down the borehole to support the downhole pump. As the pumping unit operates, the polished rod and string of sucker rods raise and lower causing a pump to lift the fluid from the reservoir up to the surface.

It is often desirable to monitor conditions of a wellhead and/or the operation of the pumping unit. In the former regard, wellheads are commonly monitored to detect the escape of hydrocarbons (e.g., gases or fluids), which may result in, for example fire hazards. In the latter regard, it is known that a number of downhole conditions can affect the operation of the pump. For instance, when well production rate does not fill the pump, the pump can become jammed, worn or experience other difficulties. Typically, there are no sensors to measure conditions at the downhole pump, which may be located thousands of feet underground. Instead, numerical methods are used calculate the position of the pump and the load acting on the plunger from measurements of the position and load for the sucker rod string at the surface wellhead. These measurements are typically made at the polished rod, which is a portion of the sucker rod string passing through a stuffing box at the wellhead and connecting to the pumping unit.

Devices for monitoring the surface conditions of a sucker rod well pumping unit are commonly referred to as sucker rod pump dynamometer systems. A typical dynamometer system has a load cell mounted on the polished rod, between the pumping unit and the polished rod. In various embodiments, the load cells monitor forces on the polished rod to determine the load on the polished rod. Such load cell measurements are often obtained in conjunction with motion characteristics of the rod including top of stroke, bottom of stroke and rod acceleration during the stroke. Use of information from the load cell is sometimes used to create what the oil industry refers to as a dynamometer card or dyno card. Such a dyno card primarily focuses on two variables: the motion/displacement of the polished rod (e.g., as measured from its topmost position) and the tension/force in the rod. These variables are graphed against each other with motion/displacement on the horizontal axis and the tension/force on the vertical axis. The resulting graph or plot shows the system is in cyclic motion; the resulting graph/curve has a closed locus. Travel once around the locus takes the same amount of time as it takes the rod pump to complete one full cycle of down stroke from a top most position and upstroke returning to the top most position. The shape of this plot is sometimes used to diagnose problems with the pump and/or alter the operation of the pumping unit.

While these surface-measured data provide useful diagnostic information, they may not provide an accurate representation of the same properties observed downhole at the pump. Because these downhole properties cannot be easily measured directly, they are typically derived from the surface data. However, due to logistic constraints, such dynamometer systems most commonly gather such surface data intermittently and such data is often analyzed off-site.

One logistic constraint of dynamometer systems is the remote locations of many oil and gas wells. More specifically, many wells are in remote locations where electrical power is not readily available. Pumps of such remote wells are commonly diesel or gas (e.g., natural gas) powered. Accordingly, there is a limited electrical supply for the dynamometer system. To conserve energy, such systems typically take measurements once or twice a day or even less frequently.

SUMMARY

It has been recognized by the inventors that improved well control could be achieved by providing a self-powered well monitoring unit, which may include a dynamometer system. Along these lines, a self-powered system could take nearly constant measurements allowing for more frequent well adjustment. In a further arrangement, such a self-powered system could include wireless (e.g., cellular, internet) capabilities. In such an arrangement, raw or processed data may be wirelessly transmitted for remote analysis in near real-time. The ability to wirelessly transmit data further permits monitoring additional well head conditions (e.g., environmental conditions).

In an aspect, a monitoring system for use with an oil and gas pumping unit is disclosed. The system includes a load sensor assembly that generates a load or force output that is indicative of the force between a crossbar/carrier bar and a polished rod clamp. The system further includes a distant sensor that generates position output indicative of the location (e.g., instantaneous position or location) of the load sensor relative to a wellhead.

The load sensor assembly and distant sensor are in operative communication with a processor and a wireless communication device disposed within a housing. The housing further includes a battery connected to and charged by a solar panel. The battery provides power the electrical components of the system. The processor and wireless communication device are utilized to wirelessly transmit data associated with at least the load sensor assembly and the position sensor.

In an arrangement, the housing is an intrinsically safe housing and explosion proof. Such a housing provides a safety benefit when being used in oil and gas applications where volatile gases may be present. In a further arrangement, the housing is a pressure tight vessel. In such an arrangement, the housing may further be pressurized above atmospheric pressure. In such an arrangement the housing may include an internal pressure sensor that allows for monitoring pressure within the housing. Upon loss of pressure, the monitoring system may shut down. Such shut down may occur upon pressure loss and/or upon pressure loss and identification of volatile gases surrounding the housing. In the latter regard, the monitoring system may include one or more gas sensors operatively connected to the processor.

In an arrangement, the load sensor assembly is removably coupled to the housing. Such removable coupling of the load sensor assembly to housing permits adjusting the orientation of the housing relative to the load sensor if desired. Further, such removable coupling isolates the housing and its internal components from the load sensor assembly, which is subject to occasional damage during normal operations. Stated otherwise, such removable coupling allows for replacement of the load sensor assembly without replacement of the housing, its internal components and or the solar panel.

DETAILED DESCRIPTION

Reference will now be made to the accompanying drawings, which at least assist in illustrating the various pertinent features of the presented inventions. The following description is presented for purposes of illustration and description and is not intended to limit the inventions to the forms disclosed herein. Consequently, variations and modifications commensurate with the following teachings, and skill and knowledge of the relevant art, are within the scope of the presented inventions. The embodiments described herein are further intended to explain the best modes known of practicing the inventions and to enable others skilled in the art to utilize the inventions in such, or other embodiments and with various modifications required by the particular application(s) or use(s) of the presented inventions.

Figure 1:
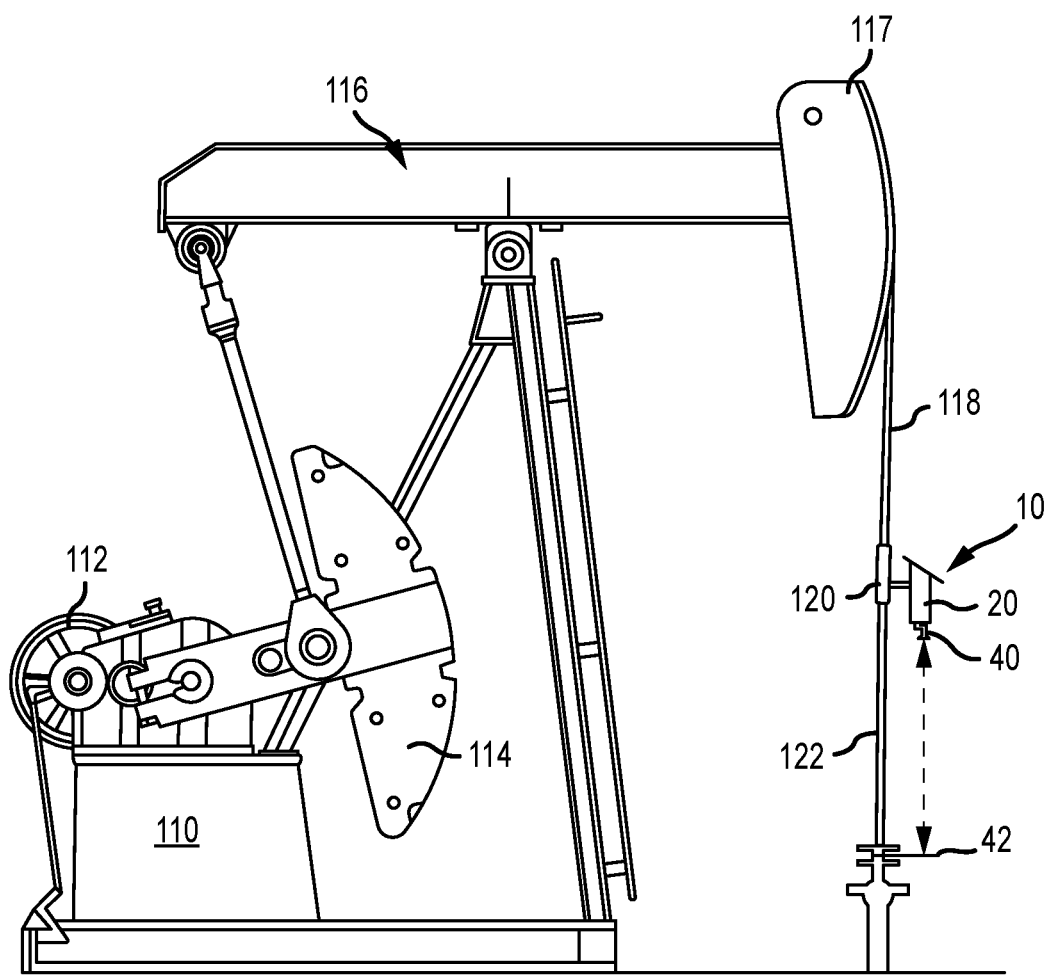
FIG. 1 illustrates a pumping unit with a monitoring system.

The basic components of a typical rod pumping unit are illustrated in FIG. 1. The pumping unit includes a motor 110, which may be an electric, diesel or gas motor, driving a gear box 112 and associated counter weight unit 114. The gear box 112 drives one end of pump jack or walking beam 116. The opposite end of walking beam 114 connects to the upper end of sucker rod string or polished rod 122. More specifically, the opposite end of the walking beam includes a rounded 'horse head' 117 that connects to the polished rod via two cables or bridles 118 (only one shown) and a carrier bar 120. The polished rod connects to the sucker rod string and passes through a stuffing box 124 of the wellhead. The attached sucker rod extends through the wellbore (not shown) to a downhole pump (not shown). Though illustrated as utilizing a pump jack, such illustration is presented by way of example and not by way of limitation. That is, the system presented herein may be utilized with other pumping systems.

As noted above, it is often desirable to monitor the operation of the pumping unit and/or the wellhead. For instance, it may be desirable to pump at the highest rate possible to maximize oil production without allowing the pump to go dry which can cause mechanical failure of the pump. Various adjustments can be made to the operation of the pumping unit (e.g., motor speed, counterweight and stroke length) to optimize production if operating parameters of the pumping unit and/or well are known. Along these lines, the operation of the pumping unit is often controlled using information from a dynamometer, a device which records load versus displacement during the pumping cycle. On some wells, dedicated dynamometers are sometimes used to continuously monitor pumping unit operation, thus improving performance and minimizing failures. However, wells having dedicated dynamometers that are capable of continuously monitoring the operation of the pumping unit typically require a dedicated electrical power source to power the dynamometer. Further, such systems typically require complex on-site analysis systems, which likewise require a source of electrical power. Accordingly, remote production wells typically utilize an intermittent dynamometer system to preserve electrical power (e.g., prolong battery life).

The primary input to a dynamometer or pump-off controller is the time varying load on the sucker rod string, and in particular, the polished rod portion positioned at the upper end of the rod string. Pump-off controllers typically use a permanent electronic load cell attached to the polished rod to measure rod load.

Figure 2:
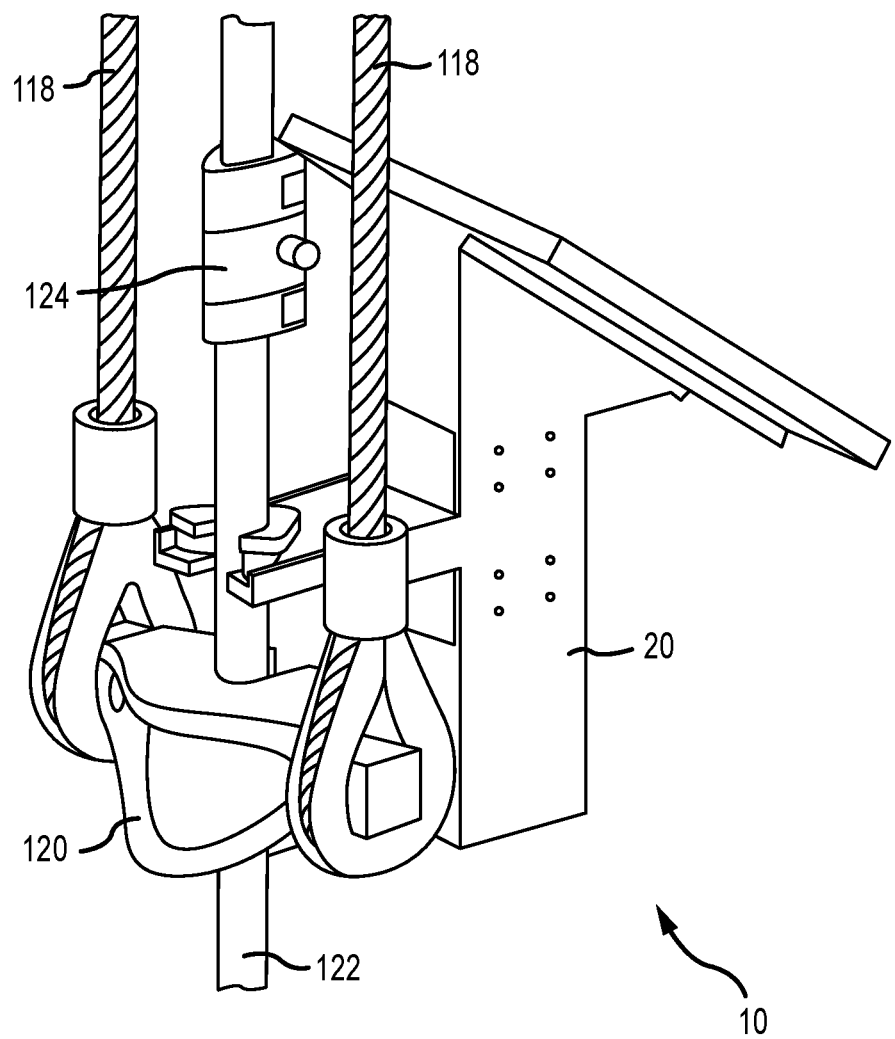
FIG. 2 illustrates the bridle and monitoring system.
Figure 3:
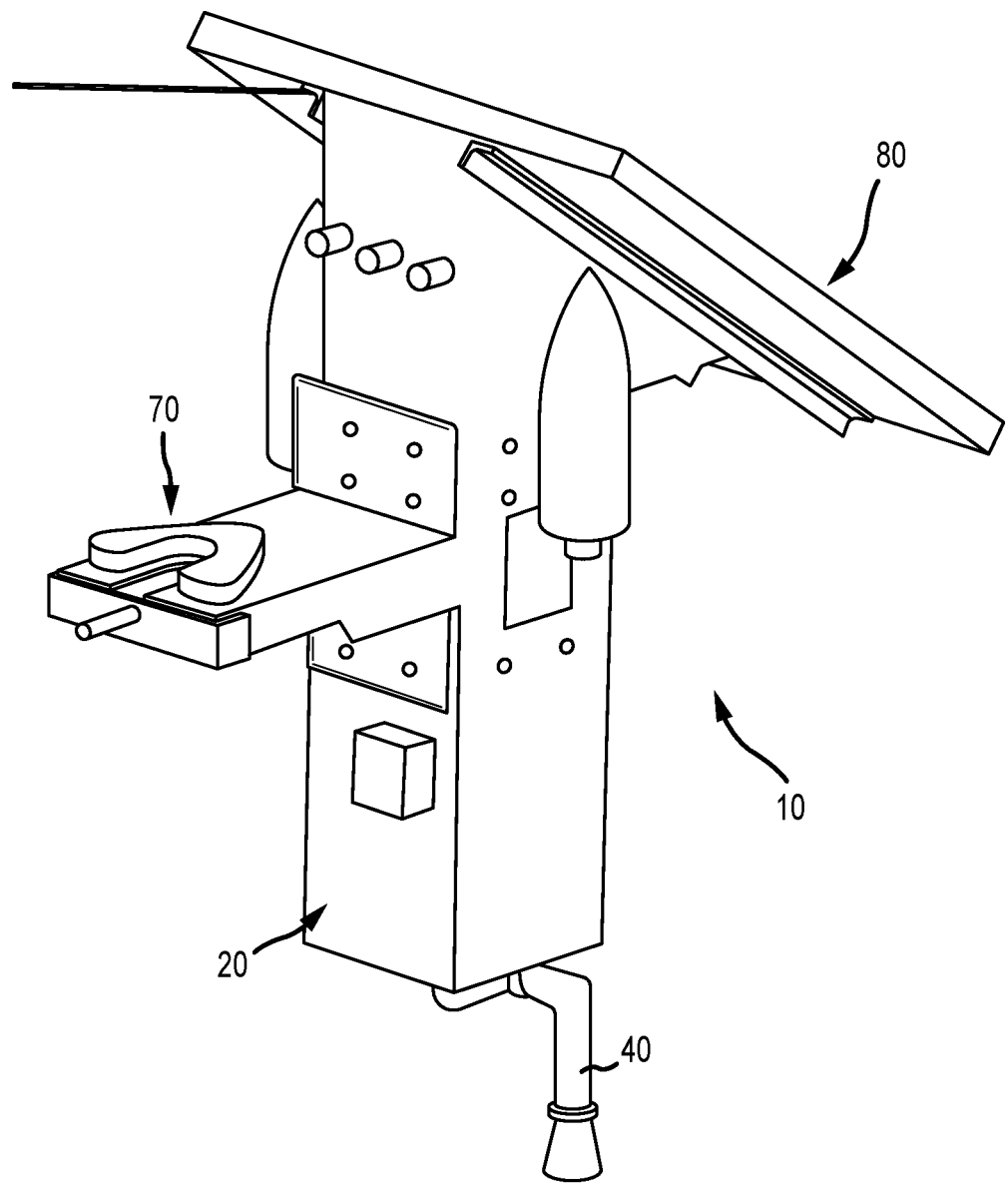
FIG. 3 illustrates a perspective view of the monitoring system.

The presented system is directed to an electronic monitoring system having various sensors for monitoring the pumping unit and/or well head. In one embodiment, the system includes a load cell that can be used to generate dynamometer information. The monitoring system overcomes shortcomings of prior dynamometer especially for remote well applications as the system is self-powered (e.g., solar powered) and has wireless communication capabilities allowing remote monitoring in substantially real-time. As shown in FIGS. 1 and 2, the monitoring system 10 is adapted for attachment to the pumping unit between the carrier bar 120 and a clamp 124 attached to the polished rod 122. As shown, the polished rod passes through a recess or aperture in the carrier bar 120 and the clamp 124 is affixed to the polished rod 122 at a location above the carrier bar 120.

Once positioned between the carrier bar 120 and the clamp 124, the monitoring system 10 can monitor various wellsite parameters. In one embodiment, load cells of the monitoring system are compressed between the carrier bar 120 and the clamp 124 to measures the varying force on the polished rod while the pump jack moves the polished rod up and down. Further, the monitoring system 10 also provides position information of the polished rod 122. As will be appreciated, the primary inputs needed by a dynamometer system are the total load on a polished rod and the corresponding position of the polished rod. The monitoring system 10 is operative to measure such force and position information and wirelessly transmit this data to an off-site location.

As shown in FIGS. 2-4B, the monitoring system includes four primary components: a housing 20, a range/distance sensor 40, a load sensor assembly 70, and a solar panel 80. The present inventors recognize that the monitoring system will typically be utilized in the occasional presence of flammable vapors, liquids and/or gasses. That is, the monitoring system will be located in proximity to an oil and gas well head. Accordingly, the inventors have designed the monitoring system to be intrinsically safe for hazardous locations rated as Class 1 Division 2 and/or Class 1 Division 1 hazardous areas. Accordingly, the presented monitoring system 10 is rated for Class 1 Division 2 and Class 1 Division 1 hazardous areas. Accordingly, the solar panel 80 is rated for Class 1 Division 2 hazardous areas and is crash resistant while the housing is rated for Class 1 Division 2 and Class 1 Division 1 hazardous areas.

In order to provide a protection technique that qualifies for Class 1 Division 1 or 2 locations, the present housing 20 is explosion proof and is pressurized with a non-flammable gas. To meet the criteria for explosion proof rating, the housing is designed to contain any explosion originating within its interior and prevent sparks from within its interior from igniting vapors or gases in the air surrounding the housing. In the present embodiment, the housing 20 has been designed as a pressure vessel (e.g., a pressure-tight housing) that may be purged and pressurized through one or more nozzles 22 coupled to the housing 20. The nozzles 22 allow pressurizing and purging the enclosure with inert gases such as, but not limited to, Nitrogen or Carbon Dioxide. Typically, the housing is pressurized to at least 5 psi above atmospheric pressure and more commonly to at least 10 psi above atmospheric pressure. The housing 20 also includes a fail-safe system that may shut the system off if pressure drops below a predetermined minimum. That is, if the seal of the pressure vessel is compromised, the system may discontinue operation.

The housing 20, in the present embodiment, is a square pipe that can be cut at different length to encapsulate electrical equipment. Though the square configuration provides a number of benefits (as further discussed herein), the pressure vessel/housing 20 is not limited to this particular configuration. In any embodiment, the housing 20 encloses numerous components. These components may vary between different embodiments and may include any or all of the following and/or additional components: batteries; computer processors; video cameras equipment; enhanced optical infrared cameras equipment; computer DRAM (Random access memory modules); MPPT or PWM solar charger controllers; DC/DC power converters; amplifier circuits; magnetometers; potentiometers; gyros; analog to digital converters; cellphone modems; satellite modems; radio equipment; sonar equipment; pressure sensors; temperature sensors and/or infrared emitters detectors/lasers (e.g., Lidar range finder).

In the present embodiment, the housing 20 has two entry points at the top and bottom of a square tube or pipe. Each entry point has a lid 26A, 26B capable of containing the pressure inside the housing 20. Along these lines, each lid may further include a gasket. In the present embodiment, the top lid 26A is secured to the housing 20 at an angle and the bottom lid 26B is secured perpendicular to the enclosure. However, this is not a requirement.

The use of a square or possibly rectangular housing 20 (e.g., in cross section) provides a number of benefits for the monitoring system 10. Initially, the flat surfaces of the housing 20 allows attaching the load sensor assembly 70 (described in more detail below) on different surfaces of the housing 20. As shown, the square pipe housing 20 has four flat surfaces phased 90 degrees to each other. In the event the pumping unit is not installed with the horse head on a southern direction, the housing 20 can be rotated and securely mounted in the preferred direction of maximum sun exposure regardless of the installation direction of the pumping unit. That is, the solar panel 80 may be directed to a southern exposure to enhance solar charging.

In the illustrated embodiment, the top of the housing 20 is angled to maximize direct surface exposure of the solar panel 80 to the sun. That is, the top surface is cut at an angle to receive the solar panel 80. The angle of the cut is dependent of the location of the well with respect to the circumference of the earth and the average vertical height of the sun over the horizon. Well locations closer to the earth poles will require higher cut angles in order to maximize exposure of the solar panel's surface area to the sun. In an alternate embodiment, the solar panel may be mounted to the housing via a rotating hub (not shown) permitting the a user to direct the orientation of the solar panel. In any arrangement, power cables extend from the solar panel into the housing via one or more intrinsically safe port or plug in the housing.

The elongated shape of the tubular housing 20 also increases the internal area that holds the internal components while reducing the disturbance of air as the monitoring system 10 moves up and down with the pumping unit. Further, the elongated shape exposes more surface area in same direction of movement of the pumping jack unit. This exposes air flow over the surface of the housing e 20 for longer periods of time allowing improved monitoring of air, which may include volatile gases. That is, hazardous gas detectors sensors secured externally to the housing 20 are better able to capture small quantity of hazardous gasses as the elongated housing 20 cuts through the air vertically in the upward or downward direction. Further, the elongated enclosure help maintain the surface area of the housing at the same temperature of the surrounding in areas of direct sun exposure.

As noted, the monitoring system 10 includes a load sensor assembly 70 for measuring forces on the polished rod. In one embodiment, the housing 20 of the monitoring system 10 is configured for mounting on or near the bridle/crossbar of a pumping unit with the load sensor assembly. Of note, it is important to separate potential impact points between the crossbar and the rod clamp from the intrinsically safe housing 20. Impacts between the crossbar and the rod clamp(s) can result in forces strong enough to break, bend or destroy equipment there between. As will be appreciated, the bridle/crossbar of a pumping unit carries all the weight of the rods and the fluid being lifted to the surface. It is common that these rods fail for several reasons under long cyclical tension and compression stresses. Also, if the downhole pump connected to the rods gets stuck large amounts of force/weight is directly applied to the rods and the crossbar. It is also common in areas of high viscosity fluid production to see a phenomenon called rod floating. Rod floating can occur when the fluid traveling between the annular space of the rods and the tubing is so viscous that the weight of the rods is not enough to maintain the rods in tension and, therefore, the bridle and crossbar travels faster downward than the rods when the horse head is moving down. In this situation, when the crossbar reaches the bottom of its stroke and starts to move upwards the rods are still moving downwards. This creates a high impact point between the crossbar and the rod clamp. Component disposed between the crossbar and the rod clamp may be damaged or destroyed by the impact between the crossbar and the rod clamp.

The presented monitoring system locates the load cells of the load sensor assembly 70 away from to the intrinsically safe housing 20. This separates potential impacts to the load sensor assembly 70 from the intrinsically safe housing 20. In the event that a high impact is applied on the load sensor assembly 70, the impact does not affect the intrinsically safe housing 20 containing most of the components of monitoring system. In such an event, impact damages are limited to the load sensor assembly 70. The load sensor assembly 70 can be tested and/or replaced without requiring replacement of the intrinsically safe housing 20 thereby minimizing repair costs associated with rod and bridle impacts. Stated otherwise, the load sensor assembly 70 may be replaced while the intrinsically safe housing 20 and all of its components may be reused.

Figure 5A:
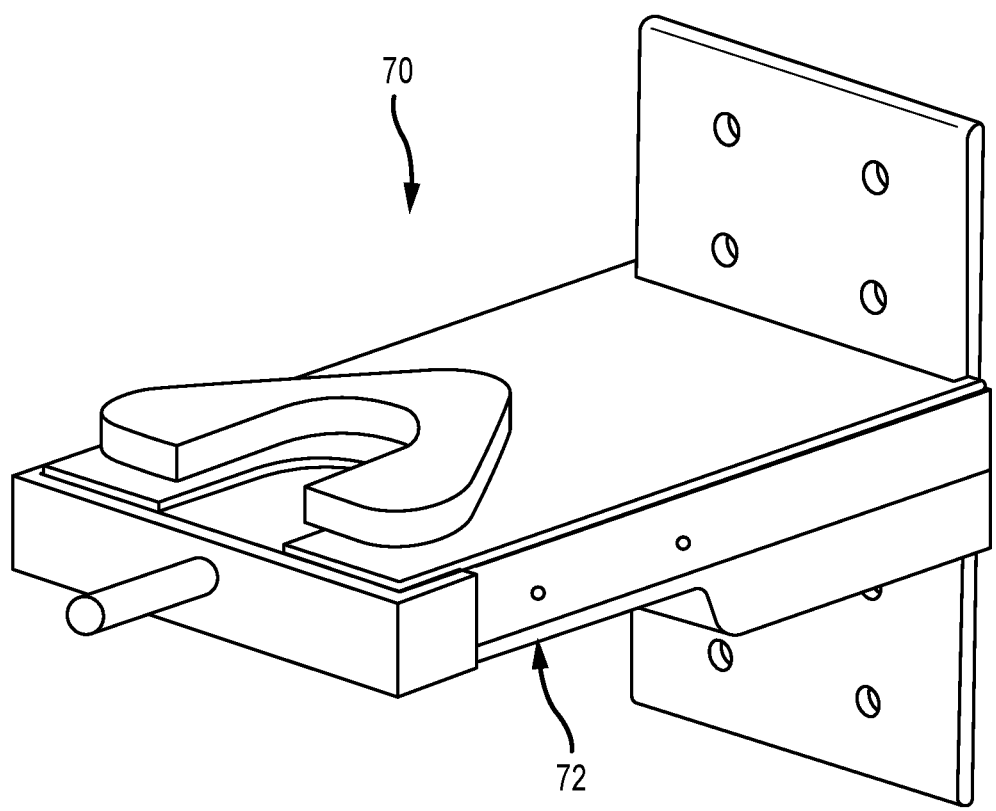
FIG. 5A illustrates a perspective view of a load cell assembly.
Figure 5B:
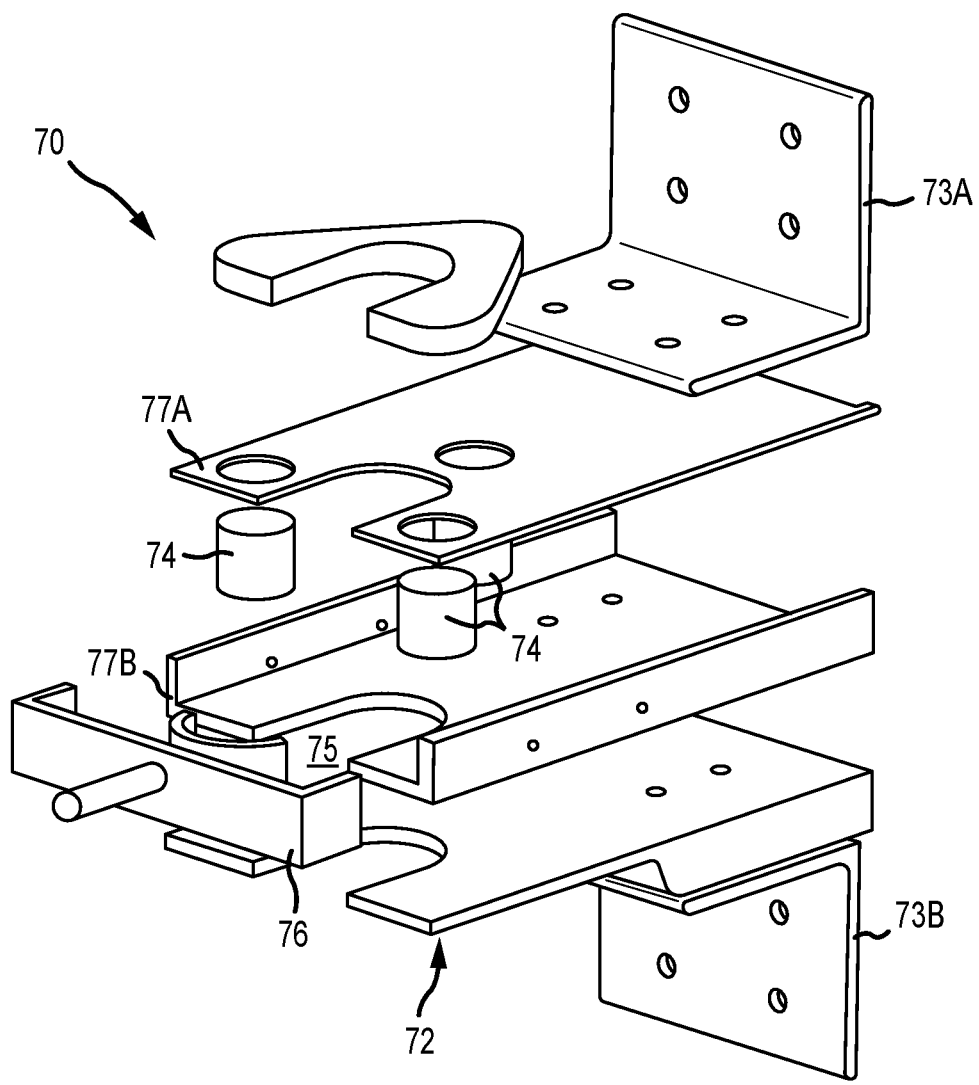
FIG. 5B illustrates an exploded view of FIG. 5A.

As shown in FIGS. 5A and 5B, the load sensor assembly includes a support structure or load cell basket 72 that is configured for attachment to the housing 20 utilizing first and second angled brackets 73a, 73b. However, other attachment mechanisms may be utilized. In the illustrated embodiment, the load sensor assembly 70 attaches to mounting holes 78 of the housing 20. In the present embodiment, the mounting holes are located on at least 3 of the 4 faces of the tubular housing. This allows rotating the housing to better align the solar panel to a direction that enhances solar exposure for enhanced battery charging.

The load cell basket 72 includes a receiving channel or U-shaped recess 75 that is configured for disposition around the polished rod. In the illustrated embodiment, the load cell basket 72 includes a forward clamp 76 that connects the open ends of the U-shaped recess once the basket is disposed about the polished rod to secure the basket 72 to the polished rod. As shown, the load cell basket 72 includes spaced upper and lower plates 77a, 77b. One or more load cells 74 may be disposed between these plates. It will be appreciated that the load cell basket is capable of carrying any number of load cells/sensors.

Each load cell 74 is individually mounted on the load cell basket. In the present embodiment, the load cells 74 are spatially distributed around the U-shaped recess and, hence, the polished rod evenly in order to accurately capture the entire weight of the rods. Three load cells are preferred to achieve accurate reading. However, the number of load sensors may vary.

The load cells 74 in the present embodiment are column type sensors. However, the load cells are not limited to column type sensors. Any type of load sensor that is capable to capture and support the entire weight of the rod string can be mounted on the load sensor basket 72. In any arrangement, the load cells 74 are coupled to electronics within the housing via wiring (not shown). This wiring passes through an intrinsically safe port or plug within the housing to connect the load sensors to the electronic control of the monitoring system 10. Once installed between the crossbar and the polished rod clamp, the load cells can be connected to the main electronic board of the monitoring system 10 to send the load data (e.g., outputs) directly to, for example, servers through the internet using cellphone or satellite modems. The data may be sent in raw form or preprocessed.

Figure 6A:
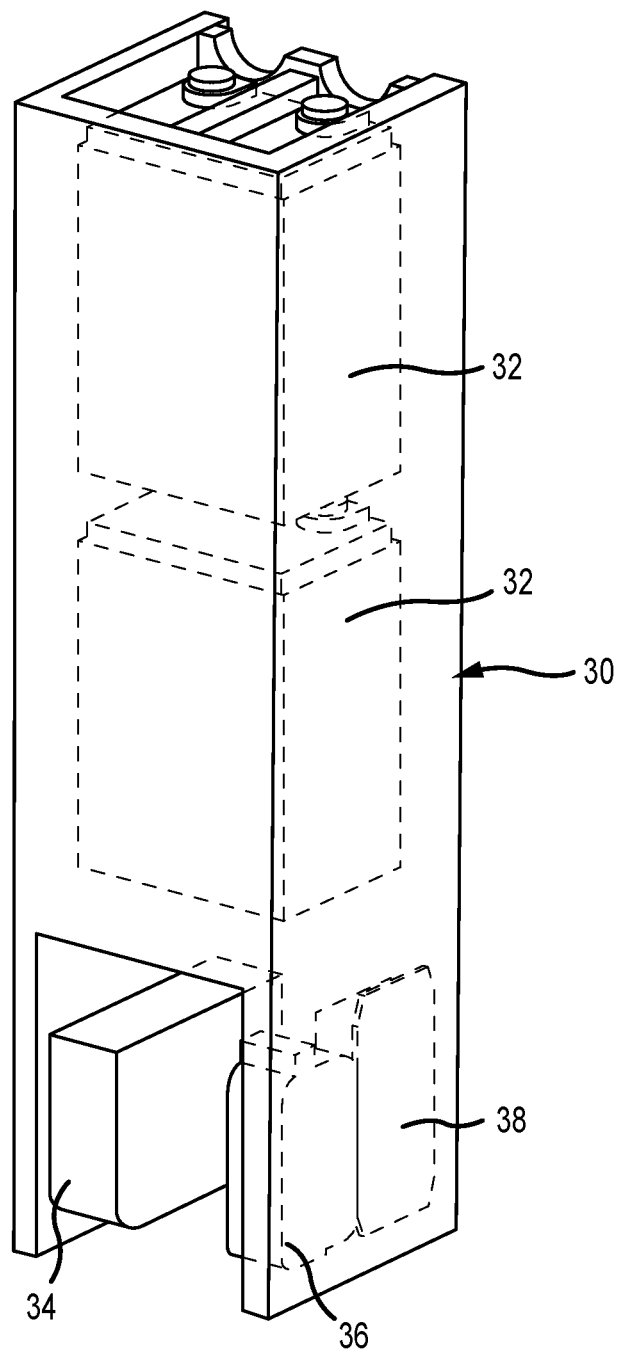
FIG. 6A illustrates a front view of internal components of the monitoring system.
Figure 6B:
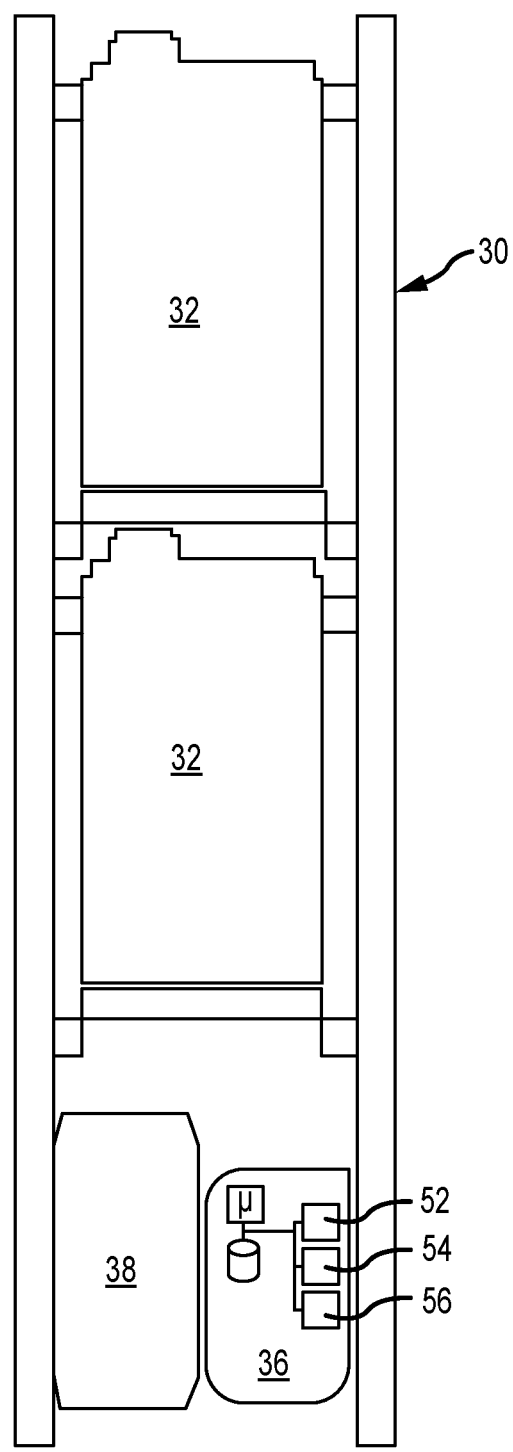
FIG. 6B illustrates a side view of internal components of the monitoring system.

The housing 20 has a generally hollow interior housing a number of monitoring system components. In the present embodiment, the housing 20 receives an internal casing 30 that supports various components within the housing 20. The internal casing is sized for generally conformal receipt within an interior of the housing. See FIGS. 6A and 6B. In the present embodiment, the internal casing 30 is inter made of a non-metallic material such that electrical conduction of the casing 30 is very low. Use of a nonconductive internal casing to support the internal components protects these internal components (e.g., electronics and batteries) from external sources of electricity. As will be appreciated, pumping units that are not fully grounded and can be prime targets for lighting during storms. If lighting hits the pumping unit, all electronic components are protected against such events.

As shown, the internal casing 30 supports batteries 32 and various electronics within the housing 20. In addition, in the event of high impact between the crossbar and rod clamp, the internal casing 30 provides the necessary support to maintain the batteries and electronics securely in place within the housing.

In the illustrated embodiment, the internal casing 30 supports two batteries 32 above the electronics of the system. The electronics include a solar charge controller 34, which is electrically connected to the solar panel and the batteries. Electrical connections are not shown for clarity. Generally, the solar panel provides an electrical output (e.g., DC output) which is received by the solar charge controller 34, which conditions the energy for receipt by the batteries 32. The batteries provide power for the electronics of the system.

As previously noted, the monitoring system 10 provides the ability to monitor various wellsite parameters including loads on the polished rod and positions of the polished rod. Accordingly, the system 10 utilizes an electronics package 36 that allows for controlling the various functionality of the system. The electronics package 36 includes a processor/microprocessor, storage (e.g., RAM, EEPROM, etc.) and a master electronics board. The electronics package may incorporate and/or control the various different sensors discussed herein. Further, the electronics package includes a switch (not shown) that allows for disconnecting power from the processor and all other electronics in the event a sudden loss of pressure is experienced inside the enclosure. In one embodiment, power is disconnected for all pressure losses. In another embodiment, power is only disconnected if flammable hazardous gases are detected in the atmosphere. Yet further, the electronics package controls a modem 38, which allows the system to communicate with, for example, third-party data providers, connect directly to the internet (e.g., via wireless carriers and/or private networks) or any provider of cellular or satellite connectivity.

In an embodiment, the monitoring system 10 monitors hazardous and/or non-hazardous gases. In such an embodiment, the housing 20 may include one or more external gas sensors 50. See FIGS. 4A and 4B. Such gas sensors typically have a sensing element external to the housing that is connected to the system processor via an appropriate coupling. As will be appreciated, wellheads for oil and gas wells equipped with pumping units always include a stuffing box on the wellhead. If not serviced regularly, the stuffing box can leak hydrocarbons to the atmosphere. Accordingly, one or more external gas sensors may be utilized to identify such leaks. The type, model, brand of the gas sensor/detector varies depending on the application. Several different gas sensors/detectors can be mounted externally to the enclosure to serve different functions. In oil and gas hazardous area three commonly used gas detectors are methane ($CH_4$), Carbon Dioxide ($CO_2$) and Hydrogen Sulfide ($H_2S$). However, the use and combination of gas detectors is not limited to these three. In the event hazardous levels of any of these three gases (or any other gases or a combination of gasses) is detected by the sensors 50, the processor is configured to send a message to the well operator via the internet, cellphone, and/or satellite modems. The message contains the necessary information for the well operator to take the necessary safety procedure to operate the well.

The monitoring system 10 is also operative to monitor various internal conditions. Along these lines, the system includes a pressure sensor 52, a temperature sensor 54 and a humidity sensor 56. The pressure sensor 52 is located inside the housing 20 and directly attached to the master electronic board and connected to the computer/processor. The pressure sensor 54 generates continuous data to monitor the internal pressure of the housing 20. In the event any pressure loss is identified inside the housing several actions may be taken. For instance, the monitoring system 10 may immediately be disconnected from the power if hazardous flammable gasses are detected by the gas sensors. Additionally, a pressure loss alarm may be generated and communicated via email, text or phone call to the well operator (e.g., prior to shut down/power disconnection). All necessary information to identify the unit location may be provided in the message to the operator. In any case, the monitoring system 10 is prepared for an emergency shut down in the event a loss of pressure in the housing. If the housing maintains an internal pressure at a predetermined pressure higher than atmospheric pressure, the unit will continue to function normally. The temperature sensor 54 is located inside the housing 20 and is directly connected to the master electronic board. When powered, the temperature sensor generates continues data to monitor the internal temperature of the monitoring system 10. In the event internal temperature of the monitoring system 10 surpasses the min/max operating temperature of any of the internal electronics or components the unit is disconnected from the power to protect the electronic and eliminate the possibility of any potential ignition source.

The humidity sensor 56 is located inside the housing 20 and is directly connected to the master electronic board that is also connected to the main computer. When powered, the humidity sensor generates continuous data to monitor the internal humidity of the monitoring system 10. In the event the internal humidity surpasses the min/max operating humidity of any of the internal electronics or components the unit is disconnected from the power to protect the electronics and eliminate the possibility of any potential ignition source.

When the housing 20 is equipped with a cellular modem to transmit any data to servers using internet protocols for data transmission, two antennas are preferable to successfully transmit considerable data. A main antenna 60, and a diversity antenna 62. See, FIG. 4B. Both antennas work in conjunction to communicate directly with cellphone towers that can be located several miles away from the location of the pumping unit.

In a further embodiment, the system may include one or more cameras (not shown) for monitoring the wellhead. The camera(s) may detect of leaking stuffing box by identifying spillage of produced water and/or hydrocarbons to the ground. In the event of a failed seals in the stuffing box (which happens regularly) image recognition software will detect changes between several images which in most cases will be caused by the presence of spilled hydrocarbons on the ground or frame of the camera. The imagery data is sent over wireless networks to a server and communicated to the operator of the well.

The housing may include additional features. For instance, insulation material may fill the interior of the housing 20. Such insulation material may be pressed or injected in any void space between the internal casing and the external housing. Such material helps control the swings in temperature inside the housing. Large temperature swings can cause premature failure of electronics and it can create condensation inside the unit. The insulation material helps stabilize the temperature inside the unit.

Another feature is the use of hanging cables 68 which support the monitoring system 10 from falling forward in the event the rods start to float and any weight on the load sensors is lost. See FIG. 4A. In certain situation, paraffin and asphaltines can start to deposit inside the tubing and around the rods. When this happens, excessive friction is encountered by the rods as they move up and down. The friction can become so high that the rods start to float over the bridle. Any weight that was keeping the unit pinned down against the bridle is reduce and the bridle starts to travel down faster than the rods. Without the hanging cables, the unit could fall forward away from the bridle. The hanging cables keep the unit from falling forward and in a straight up position allowing the rods to move freely up and down through the bridle.

Though the monitoring system 10 may monitor any number of well head parameters, a primary function of the system is to provide dynamometer information. As noted above, a dynamometer system requires two primary inputs to determine the time varying load on the polished rod, force and position. The monitoring system measures forces on the polished rod using the load sensor assembly 70 while a range/distance sensor 40 provides position information.

Prior systems have attempted to utilize accelerometer data to calculate a real time position and displacement of the pumping unit and polished rod. However, the accuracy of these measurements strictly depends on the geometry of the pumping unit. Acceleration data alone, cannot produce accurate distance data by dual integration of the acceleration. During the dual integration process of the acceleration data boundaries conditions must be assigned to the mathematical equation in order to integrate from acceleration to velocity and then to distance. The total trajectory distance of the bridle (or surface stroke) must be a known variable in order to properly calculate the position of the unit along its trajectory using acceleration data. The surface stroke of the pumping unit varies accordingly to the brand and model of the pumping unit. Therefore, all parameters, linkages and overall geometry of the pumping unit must be known in order to provide the correct total trajectory distance to the equations. Often, a user or operator assumes the wrong the pumping brand and model leading to wrong calculation of position and therefore the wrong interpretation of the actual downhole condition of the pump. By using the range/distance sensor 40, as described herein, assumptions about the geometry of the pumping unit are not necessary. All calculations are absolute measurements of distance between the range sensor 40 and a reflector, and therefore no other calculation is necessary, ensuring the correct interpretation of downhole condition of the pump.

In one embodiment, the range sensor is a sonar assembly 40 and/or a magnetometer that provide position information for the polished rod. As best shown in FIG. 1, the sonar assembly 40 is disposed facing downward on a lower end of the housing 20. The sonar assembly 40 emits sound waves between the housing 20, which is attached the cross bar of the pumping unit, and a reflector 42, which is connected to the well head. The sonar assembly includes an emitter and a detector. The emitter emits, for example, ultrasonic waves while the detector detects the reflection of these waves from the reflector. Depending on the time that the signal/wave takes to come back to the detector, the sonar assembly 40 can detect the distance between the monitoring system and the reflector. The sonar assembly 40 outputs the position of the polished rod at any time. This position be correlated with force measurements at that time for use in dynamometer calculations.

Figure 7:
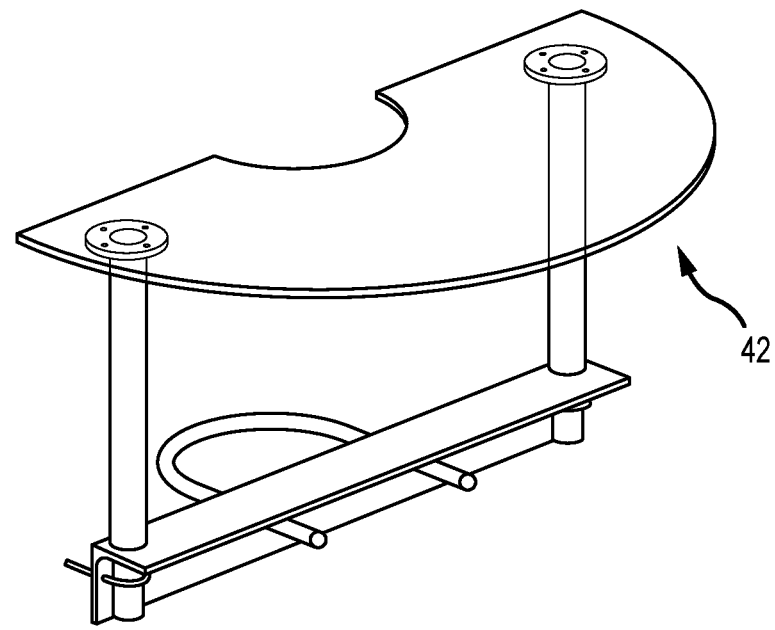
FIG. 7 illustrates a reflector plate.
Figure 7:
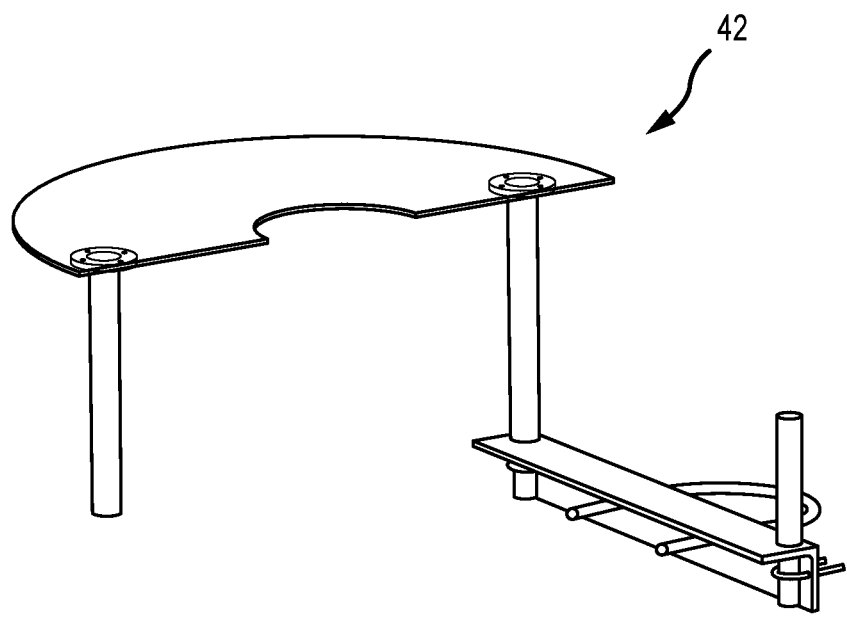

In the present embodiment, the sonar reflector 42 is a semi-circular flat surface mounted around the wellhead utilizing a clamping assembly to assist the sonar sensor in accurately provide distance and position data. See FIG. 7. The wellhead configuration of any rod pump system is composed of different shapes and sizes of equipment situated at different heights and length. In order for the sonar range finder to accurately work, a single reference point must be utilized as the target for the sonar sensor. In most situation, the bridle or carrier bar of the pumping not only moves along a vertical axis, but it also moves around its vertical axis creating a cyclical complex combination of movements as it travels up and down. If the bridle or carrier bar moves back and forth around its vertical axis, the sonar sensor also moves the same way. When this happens, the sonar range finder loses its primary reference target and finds a new target. The new target most likely is at a different location compared to the primary target. This can be any other component of the well head configuration. When the sonar sensor takes on a new target, the new distance calculated by the sensor is different than the original. Accordingly, in the present embodiment, the sonar reflector takes on a semicircular shape in order to provide the same reference target to the sonar sensor regardless of it complex motion around and along the vertical axis. Other configurations are possible.

Figure 4A:
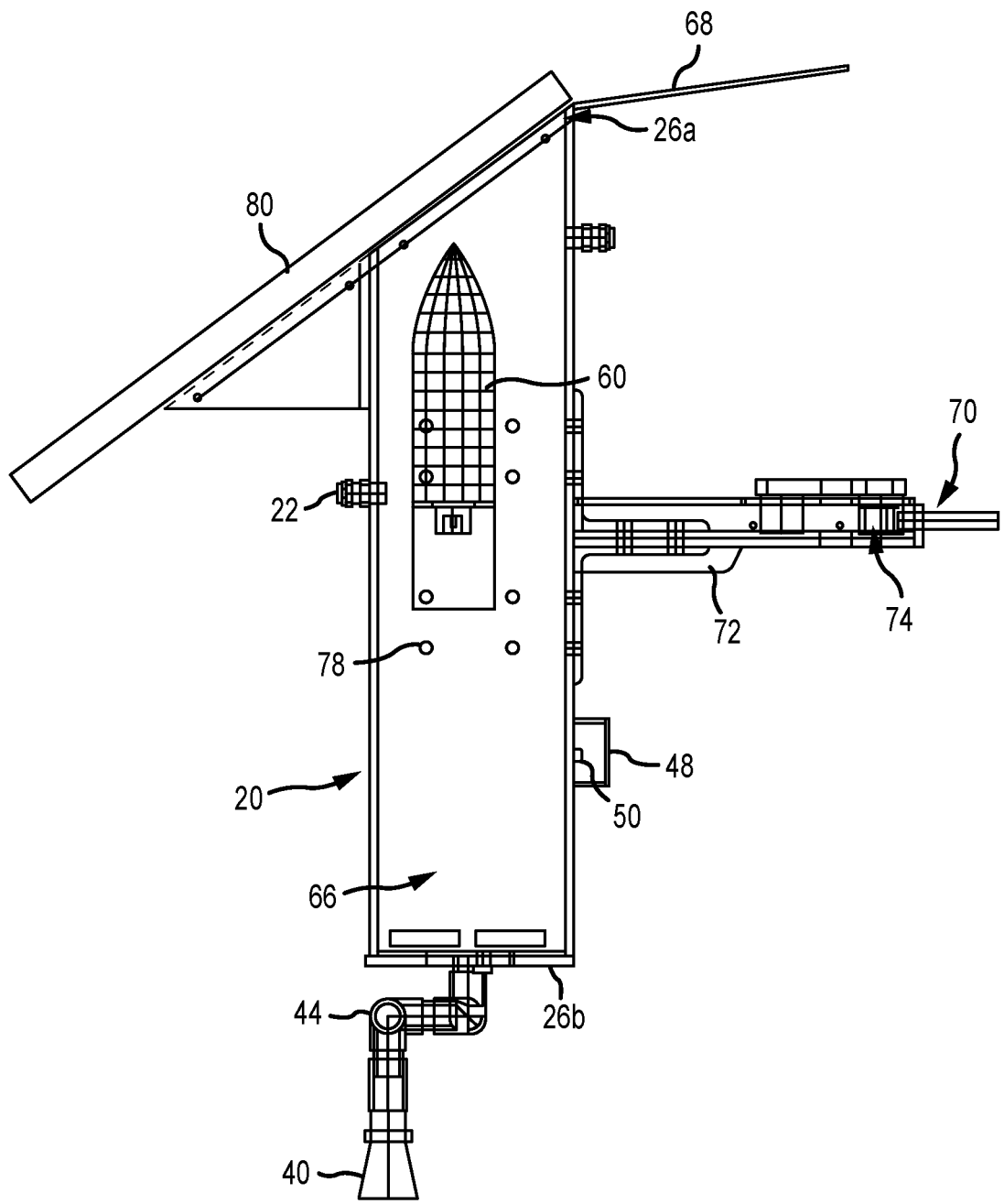
FIG. 4A illustrates a side view of the monitoring system.
Figure 4B:
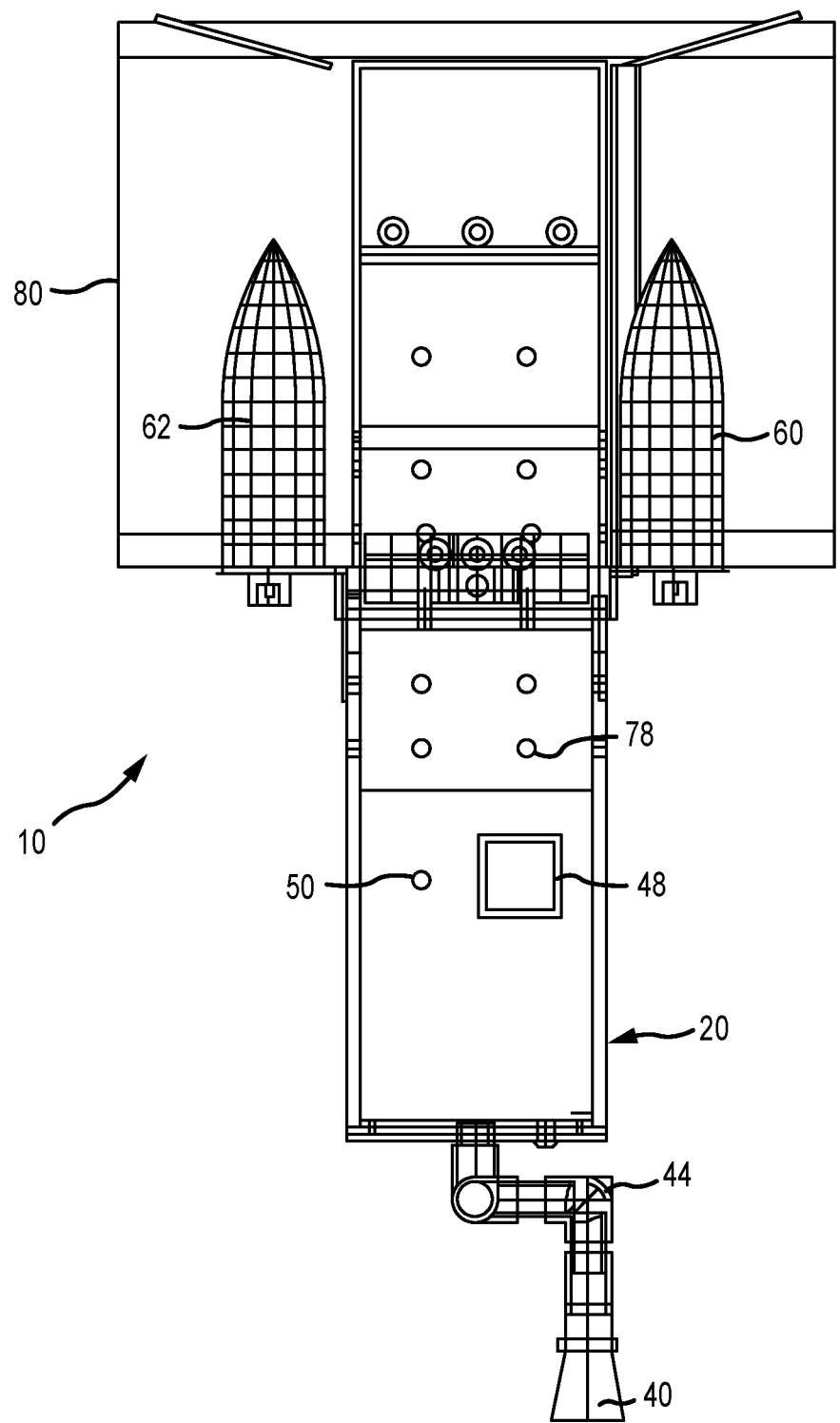
FIG. 4B illustrate a back view of the monitoring system.

As shown in FIGS. 1 and 4A, the sonar assembly is attached to the housing 20 via a sonar gimbal 44. The sonar gimbal 44 is composed of a series of tubular connections to securely attach an external sonar sensor 40 to the housing 20. Wiring from the sonar sensor passes into the pressurized enclosure via an appropriate coupling (e.g., intrinsically safe port/plug) to maintain pressure within the housing 20. The tubular composition of the gimbal 44 is such that it allows three axes of motion in order to position the sonar sensor assembly 40 perpendicular to the sonar reflector 40 or substantially parallel to the polished rod regardless of the level/orientation of the bridle/crossbar. Theoretically, a crossbar of a pumping unit pumping is perfectly horizontal or parallel to the ground. However, this is not the case in most pumping units. Cables of the bridle stretch un-evenly through time, mounting of the cables are not centered on the horse head, along with other situations that causes the bridle to not be parallel to the ground. Three axis movement and/or adjustment of the gimbal 44 allows for directing the sonar sensor 40.

When the housing 20 is secured perpendicular to a load sensor basket 72 using the mounting holes, the housing 20 adapts to the level or inclination of the bridle. If the bridle is un-even or otherwise not level, the sonar sensor moves along the three axes of the gimbal in order to accurately and continuously measure the distance from the monitoring system 10 to the reflector 42 as the system rides up and down on the bridle. If the face of the sonar sensor is not perpendicular to the reflector, the sonar wave bounces on a different direction may not be captured by the sensor.

While the sonar sensor 40 provides a highly accurate means for measuring the position of the polished rod, the sonar sensor represents a high energy use component for the self-powered system. To reduce the energy consumption of the system 10, once the sonar sensor 40 has accurately measured the absolute displacement of the pumping unit relative to the reflector 42, the sonar sensor 40 may be deactivated. During sonar measurement, data from the sonar sensor is correlated to readings of a magnetometer 48 while the pumping unit moves up and down. See FIGS. 4A and 4B. The magnetometer 48 measures the magnetic field created by the rods as the move inside and out of the tubing and well head (e.g., stuffing box) and calibrates these readings to the position measurements of the sonar sensor. After a few cycles, the sonar sensor 40 is turned off and the position calculation of the system relies on the reading of the magnetometer 48. The sonar sensor is turned off to conserve energy and to eliminate the emission of energy in the forms of waves through hazardous locations. Once calibrated, the magnetometer 48 can accurately identify the position of the polished rod with significantly reduced energy consumption.

Figure 8:
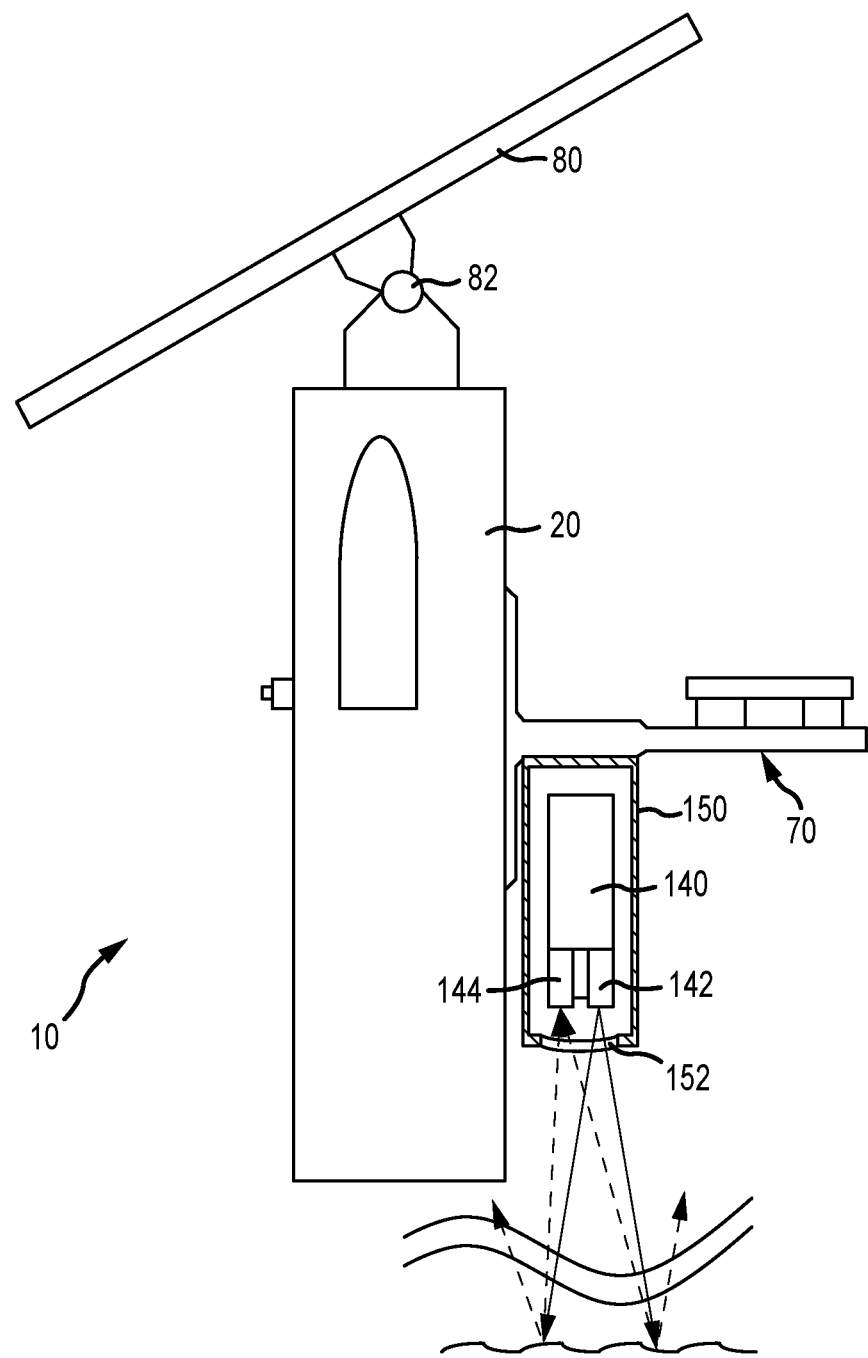
FIG. 8 illustrated another embodiment of the monitoring system.

FIG. 8 illustrates another embodiment of the monitoring system 10. As with the previous embodiment, the illustrated monitoring system 10 includes a housing 20 load sensor assembly 70 and solar panel 80. In the illustrated embodiment, the solar panel 80 is attached to the housing 20 via a movable coupling 82. This coupling 82 permits at least two axis and more preferably three axis adjustment of the solar panel 80 relative to the housing 20 to better align the solar panel with solar irradiance. In addition, the illustrated embodiment includes a lidar position sensor 140. As shown, the lidar sensor 140 is disposed in a separate housing or enclosure 150. In such an arrangement, the separate enclosure 150 may again be a sealed enclosure that is intrinsically safe and explosion proof. To permit the operation of the lidar sensor 140, enclosure 150 includes a site window 152. Accordingly, the lidar sensor 140 may emit and receive signals through the site window 152. Though illustrated as a separate enclosure, it will be appreciated that the lidar sensor may be disposed within the main housing 20. In such an embodiment the main housing will also include a site window (not shown). When utilizing the separate enclosure 150, the enclosure may be mounted directly to the load basket to enhance the position measurement of the load sensors. However, this is not a requirement.

The lidar sensor 140 provides more accurate representation of the displacement of the load cell assembly 70. As will be appreciated, lidar is analogous to sonar or radar, which use energy to determine the range, size, shape, angle or velocity of object. The main difference between sonar/radar and lidar is that sonar uses radio waves for object tracking where lidar uses focused infrared beam energy as its object tracking method. Stated otherwise, the lidar sensor 140 measures distance to a target by illuminating the target with pulsed laser light from a transmitter 142 and measuring the reflected pulses with a sensor/receiver 144. Stated otherwise, the focused infrared beam reflects off of a target, and a portion of that reflected signal returns to the receiver 144.

The lidar sensor 140 is used to detect both the distance to the wellhead and the size and orientation of the wellhead. Both parameters are necessary to accurately measure the instantaneous displacement of the load sensor assembly 70 as it travels away and towards the wellhead. That is, differences in laser return times and wavelengths can then be used to make digital representations (e.g., 3-D representations) of the target as well as calculate distance. That is, the lidar sensor 140 allows for determining a size of a target. The distance and size of the target are processed instantaneously by an onboard processor (e.g., within the lidar sensor) to accurately determine the instantaneous distance to the wellhead, valves, pipes, catch cans, gauges and any other equipment permanently or temporarily installed or located near the wellhead. Along these lines, the processor recognizes the size, shape and orientation of any object instantaneously to maintain the same point of reference. If the point of reference changes during the travel of the bridle/crossbar the distance in no longer valid and would lead inconsistency in the capture data and erroneous interpretation of the position of the bridle/crossbar in reference to the wellhead.

As previously noted, the pitch, attitude and orientation of the crossbar changes continuously as it travels away and towards the wellhead. As the load sensor assembly 70 is secured in between the crossbar and the polished rod clamp, the load sensor assembly 70 experiences the same changes in pitch, attitude and orientation as the crossbar. As the lidar sensor 140 utilizes size and/or orientation information, the measured distances account for that changes in the pitch, attitude and/or orientation. The lidar sensor 140 generates a measurement of higher accuracy.

Using the lidar sensor 140, the distance (D) to an object is calculated by taking the difference between the moments of signal transmission to the moment of signal reception. The relationship of distance (D) to returned signal strength decreases by $1/D^2$ or the square root of the distance. The relationship of a target's Cross Section (C) to return signal strength is an inverse power of four. The lidar sensor 140 transmits a focused near-infrared beam that spreads at a rate less or greater than 0.5 degrees as distance increases depending on the circumstances around the wellhead. The rate of the spread of infrared beam can be adjusted as necessary to increase the accuracy of the instantaneous distance to target or interpreted reference point.

The foregoing description has been presented for purposes of illustration and description. Furthermore, the description is not intended to limit the inventions and/or aspects of the inventions to the forms disclosed herein. Consequently, variations and modifications commensurate with the above teachings, and skill and knowledge of the relevant art, are within the scope of the presented inventions. The embodiments described hereinabove are further intended to explain best modes known of practicing the inventions and to enable others skilled in the art to utilize the inventions in such, or other embodiments and with various modifications required by the particular application(s) or use(s) of the presented inventions. It is intended that the appended claims be construed to include alternative embodiments to the extent permitted by the prior art.

What is claimed is:

1. A monitoring system for use with an oil and gas well head, comprising:
    a load sensor assembly that generates a load output indicative of a force between a carrier bar and a polished rod clamp of a well;
    a distance sensor that generates a position output indicative of a location of the load sensor assembly relative to the well head;
    a magnetometer;
    a pressure-tight housing removably coupled to the load sensor assembly, the pressure-tight housing including within its interior:
        a processor operatively connected to the load sensor assembly, the distance sensor and the magnetometer, wherein the processor utilizes the position output of the distance sensor to calibrate the magnetometer and wherein, upon calibrating the magnetometer, the processor deactivates the distance sensor, wherein a magnetic output of the magnetometer provides the position output;
        a wireless communications device for wirelessly transmitting data associated with load outputs of the load sensor assembly and position outputs of the distance sensor or magnetometer; and
        a battery that supplies power to the processor and the wireless communications device; and
    a solar panel connected to the pressure-tight housing and configured to provide power to the battery.

2. The monitoring system of claim 1, wherein the load sensor assembly comprises:
    a support basket having a first portion configured for removable coupling to the pressure-tight housing; and
    at least a first load cell supported by a second portion of the support basket for measuring forces between said polished rod clamp and said carrier bar.

3. The monitoring system of claim 2, wherein the support basket comprises a receiving channel sized to receive and partially surround a polished rod.

4. The monitoring system of claim 3, wherein the basket further comprises second and third load cells, wherein the first, second and third cells are equally spaced around the receiving channel of the support basket.

5. The monitoring system of claim 1, further comprising:
    a pressure sensor disposed the interior of the pressure-tight housing that generates a pressure output indicative of a pressure within the interior of the pressure-tight housing;
    wherein the processor is configured to disconnect power upon the pressure within the interior of the pressure-tight housing falling below a predetermined pressure.

6. The monitoring system of claim 5, further comprising:
    at least one gas sensor disposed on an exterior surface of the pressure-tight housing and operatively connected to the processor.

7. The monitoring system of claim 1, wherein the solar panel is connected to the pressure-tight housing at an angle relative to a vertical axis of the pressure-tight housing.

8. The monitoring system of claim 1, wherein the pressure-tight housing further comprises at least one nozzle for pressurizing an interior of the pressure-tight housing.

9. The monitoring system of claim 1, wherein the distance sensor is attached to the housing.

10. The monitoring system of claim 9, wherein the distance sensor further comprises a gimbal attached to the housing, wherein the gimbal provides three axes of adjustment for the distance sensor.

11. The monitoring system of claim 1, wherein the distance sensor comprises a sonar sensor.

12. The monitoring system of claim 1, wherein the distance sensor comprises a Lidar sensor.

13. The monitoring system of claim 12, wherein the Lidar sensor is housed in an enclosure separate from the pressure-tight housing.

14. The monitoring system of claim 13, wherein the enclosure further comprises a sight window, wherein the Lidar emits and detects through the sight window.

15. The monitoring system of claim 12, wherein the Lidar sensor is disposed within the interior of the pressure-tight housing.

16. The monitoring system of claim 15, wherein the pressure-tight housing further comprises a sight window, wherein the Lidar sensor emits and detects through the sight window.

17. A monitoring system for use with an oil and gas well head, comprising:
    a load sensor assembly that generates a load output indicative of a force between a carrier bar and a polished rod clamp of a well;
    a distance sensor that generates a position output indicative of a location of the load sensor relative to the well head;
    a magnetometer;
    a processor operatively connected to the load sensor assembly, the distance sensor and the magnetometer, wherein the processor utilizes the position output of the distance sensor to calibrate the magnetometer and wherein, upon calibrating the magnetometer, the processor deactivates the distance sensor, wherein a magnetic output of the magnetometer provides the position output; and a wireless communications device for wirelessly transmitting data associated with load outputs of the load sensor assembly and position outputs of the distance sensor or magnetometer.

18. The monitoring system of claim 17, further comprising:

a battery that supplies power to the processor and the wireless communications device; and a solar panel configured to provide power to the battery.

19. The monitoring system of claim 18, further comprising:

a pressure-tight housing removably coupled to the load sensor assembly, the pressure-tight housing including within its interior the processor, the wireless communications device and the battery.

20. The monitoring system of claim 17, wherein the distance sensor is one of a sonar sensor and a Lidar sensor.

* * * * *